(12) United States Patent
Steinbach et al.

(10) Patent No.: US 7,209,009 B2
(45) Date of Patent: *Apr. 24, 2007

(54) CONTROLLING A VOLTAGE CONTROLLED OSCILLATOR IN A BANG-BANG PHASE LOCKED LOOP

(75) Inventors: Gunter Willy Steinbach, Palo Alto, CA (US); Brian Jeffrey Galloway, Campbell, CA (US); Thomas Allen Knotts, Mountain View, CA (US)

(73) Assignee: Agilent Technologies, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/356,514

(22) Filed: Feb. 17, 2006

(65) Prior Publication Data
US 2006/0139108 A1    Jun. 29, 2006

Related U.S. Application Data

(63) Continuation of application No. 10/797,964, filed on Mar. 11, 2004, now Pat. No. 7,053,719.

(51) Int. Cl.
*H03L 7/06* (2006.01)

(52) U.S. Cl. ............... 331/16; 331/177 R; 331/185; 327/159

(58) Field of Classification Search ............... None
See application file for complete search history.

(56) References Cited

U.S. PATENT DOCUMENTS 6,466,096 B1 * 10/2002 DeVito .................. 331/11
7,053,719 B2 * 5/2006 Steinbach et al. ............ 331/16

* cited by examiner

*Primary Examiner*—Timothy P. Callahan
*Assistant Examiner*—An T. Luu (57) ABSTRACT

The frequency changes in a bang-bang PLL that are generated using a digital phase detector's up/down signal are initially set to produce a faster pull-in rate and then reduced to produce a slower pull-in rate. The faster pull-in involves relatively large frequency changes and the slower pull-in rate involves smaller frequency changes. The changes in frequency of a bang-bang PLL can be implemented using a step size controller that includes timing control logic and step size logic. The function of the timing control logic is to control the timing of step size changes. The function of the step size logic is to set the step size of the frequency changes that are made by the VCO in response to the pd_up/down signal that is delivered directly to the VCO from the digital phase detector.

21 Claims, 11 Drawing Sheets

CONTROLLING A VOLTAGE CONTROLLED OSCILLATOR IN A BANG-BANG PHASE LOCKED LOOP

CROSS-REFERENCE TO RELATED APPLICATIONS

This application is a continuation of prior application Ser. No. 10/797,964, filed Mar. 11, 2004, now U.S. Pat. No. 7,053,719.

FIELD OF THE INVENTION

The invention relates to phase-locked loops, and more particularly, to controlling the voltage controlled oscillator in a bang-bang phase-locked loop.

BACKGROUND OF THE INVENTION

Clock and data recovery (CDR) circuits are widely used when a data signal is sent across a communications link without an accompanying dedicated clock signal. CDR circuits typically use a phase-locked loop (PLL) to determine, from the transitions between physical data values, the exact frequency at which data is arriving and the optimum phase at which to sample the incoming data. PLLs typically include a VCO, a frequency detector, and a phase detector. The phase detector is used to determine the optimum phase at which to sample the incoming data. Phase detectors require that the frequency of a VCO be very close to the frequency of the incoming signal before frequency and phase lock can be achieved. For example, the frequencies of the VCO and incoming signal should be within 0.5% of each other before the phase detector is able to "pull-in" the VCO frequency to match the incoming signal. Frequency detectors are designed to bring the frequency of the VCO to within the pull-in range, or deadband region, of the phase detector. Frequency detectors relinquish control of the VCO signal to the phase detector once the VCO frequency has been brought into the deadband region.

PLLs often use "bang-bang" type phase detectors. Bang-bang phase detectors, also referred to as "binary" or "up/down" phase detectors, output an indication of the phase of the incoming signal relative to the VCO signal using an up or down (up/down) signal. The up/down signal has no information on how far the phase of the VCO signal differs from the incoming signal. The pull-in range of a bang-bang phase detector is proportional to the size of the immediate change in VCO frequency that results from an up or down signal. The immediate change in VCO frequency that results from an up/down signal is generally referred to as the "bang-bang step size" or simply the "step size." PLLs that utilize bang-bang phase detectors are often referred to as bang-bang PLLs.

One problem with PLLs, including bang-bang PLLs, is frequency detector overshoot. Frequency detector overshoot occurs when the frequency detector causes the VCO frequency to oscillate around the deadband region without being able to drive the VCO frequency into the deadband region. This can happen if the deadband region is too narrow. Another common problem with PLLs is charge pump leakage. Charge pump leakage can make the phase detector's pull-in range asymmetrical and can prevent the PLL from locking if the deadband region is approached from the wrong side. A narrower deadband region can remedy this problem, but this may lead to frequency detector overshoot.

Although current bang-bang PLLs work well, there is still a need for bang-bang PLLs that are less susceptible to overshoot and charge pump leakage.

SUMMARY OF THE INVENTION

In accordance with the invention, the frequency changes in a bang-bang PLL that are generated using a digital phase detector's up/down signal are initially set to produce a faster pull-in rate and are then reduced to produce a smaller pull-in rate. The faster pull-in involves relatively large frequency changes, which allow for a wider deadband region and reduce the negative effects of charge pump leakage. The slower pull-in rate involves smaller frequency changes that enable fine control of the PLL in a regular operating state. The fine control allows the PLL to achieve precise frequency and phase lock.

The changes in frequency of a bang-bang PLL can be implemented using a step size controller that includes timing control logic and step size logic. The function of the timing control logic is to control the timing of step size changes. In particular, the timing control logic controls the transition of the step size from an initially large step size to a lower step size. The timing control logic initiates a change in the step size some time after frequency lock is established. The timing control logic communicates timing control information to the step size logic via a timing control signal. The step size logic receives the timing control signal from the timing control logic and may receive a programming signal from a programming input and/or a clock signal from a clock source. The function of the step size logic is to set the step size of the frequency changes that are made by the VCO in response to the pd_up/down signal that is delivered directly to the VCO from the digital phase detector. The step size logic may be configured to provide only two step sizes, for example, a first step size that is used initially and a second smaller step size that is transitioned to after some period of time. Alternatively, the step size logic may be configured to provide multiple intermediate step sizes that provide a transition from the largest step size to the smallest step size.

BRIEF DESCRIPTION OF THE DRAWINGS

Throughout the description similar reference numbers are used to identify similar elements.

DETAILED DESCRIPTION

The task of a PLL is to lock the frequency and phase of a VCO signal to a particular signal, referred to herein as a data input signal (data_in). In PLLs with bang-bang phase detection, the phase detector adjusts the frequency of the VCO signal using a simple up/down signal. In accordance with the invention, the frequency changes produced using an up/down signal are initially set to cause a faster pull-in rate and then reduced to cause a slower pull-in rate. The slower pull-in rate is then maintained during regular PLL operation.

Figure 1:
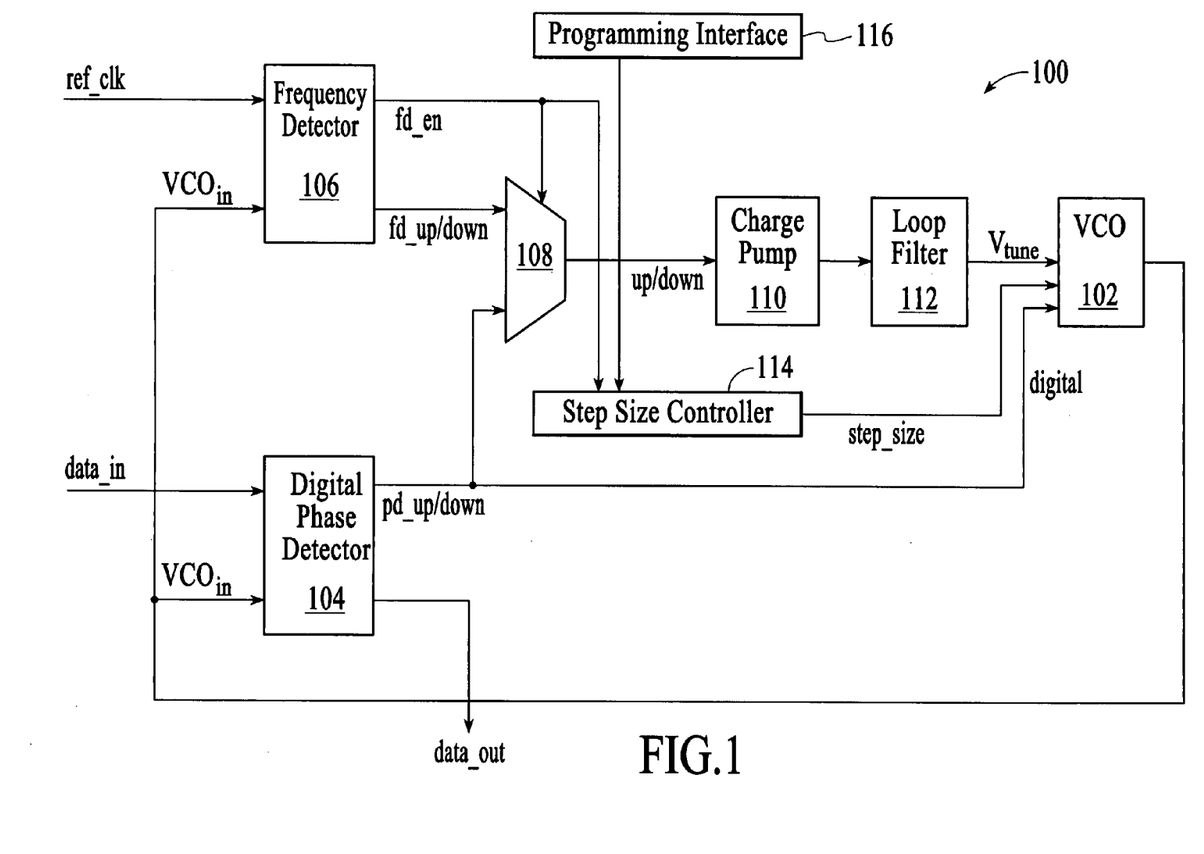
FIG. 1 depicts an embodiment of a bang-bang PLL that includes a step size controller in accordance with the invention.

FIG. 1 depicts an embodiment of a bang-bang PLL 100 that includes a voltage controlled oscillator (VCO) 102, a digital phase detector 104, a frequency detector 106, a multiplexer 108, a charge pump 110, a loop filter 112, and a step size controller 114. The digital phase detector 104 is connected to receive an input signal (data_in) from a signal source and a portion of the VCO signal ($VCO_{in}$) from the VCO. The input signal carries the data that is to be recovered. As part of the PLL operation, the digital phase detector compares transitions of the input signal with transitions of the VCO signal and generates an output (referred to herein as the "pd_up/down" signal) that indicates the phase difference between the input signal and the VCO signal. The digital phase detector produces an "up" signal when the phase of the input signal leads the phase of the VCO signal and a "down" signal when the phase of the input signal lags the phase of the VCO signal. The pd_up/down signal is provided to the charge pump via the multiplexer and directly to the VCO. An up signal drives the frequency of the VCO upward while a down signal drives the frequency of the VCO signal downward, thereby advancing or retarding, respectively, the phase of the VCO signal. The digital phase detector also outputs the recovered data (data_out). This data is not critical to the invention and is not described further. In an alternative embodiment, the pd_up/down signal is provided directly to the VCO after the pd_up/down signal passes through the multiplexer 108.

The frequency detector 106 is connected to receive a portion of the VCO signal ($VCO_{in}$) from the VCO 102 and a reference clock signal (ref_clk) from a reference clock source (often external to the system and not shown here). The frequency detector uses the reference clock signal to determine whether or not the VCO signal should be controlled by the frequency detector. The frequency detector controls the VCO when the frequency of the VCO signal is outside a pre-established deadband region that is centered at the setpoint frequency of the VCO. The frequency detector generates a control signal (referred to herein as the "fd_en" signal) that indicates whether the VCO is to be controlled by the frequency detector or the digital phase detector 104 (that is, whether control of the VCO by the frequency detector is enabled or disabled). When the frequency detector does not control the VCO because the frequency of the VCO is within the deadband region, the PLL 100 is said to be "in frequency lock." When the frequency detector does control the VCO because the frequency of the VCO is outside the deadband region, the PLL is said to be "out of frequency lock." The frequency detector also generates an output (referred to herein as the "fd_up/down" signal) that indicates the sign of the frequency difference between the frequency of the VCO signal and the setpoint frequency. The frequency detector produces an "up" signal when the frequency of the VCO is below the setpoint frequency of the VCO and a "down" signal when the frequency of the VCO is above the setpoint frequency. An up signal drives the frequency of the VCO signal upward while a down signal drives the frequency downward.

In the embodiment of FIG. 1, when the control signal (fd_en) from the frequency detector 106 is high, the output (fd_up/down) from the frequency detector controls the VCO 102. Conversely, when the control signal (fd_en) is low, the output (pd_up/down) from the digital phase detector 104 controls the VCO. The portion of the VCO signal that is received at the frequency detector and the digital phase detector may be divided by N using a signal divider (not shown). In an alternative embodiment, the function of the frequency detector can be performed by a more general "lock detector," which determines whether control of the VCO should be given up to the digital phase detector. Instead of basing the control decision on the frequency difference between the actual frequency of the VCO and a setpoint frequency (as is the case with the frequency detector), the lock detector may use other criteria, such as bit errors or consistency of phase, to determine if/when control of the VCO should be given up to the digital phase detector. Even if lock detection is not based on a frequency measurement, there is still a need for a frequency detector that generates a signal representing the sign of the frequency difference between the VCO signal and a reference signal.

The multiplexer 108 receives the control signal (fd_en) from the frequency detector 106 and allows the corresponding control signal (either fd_up/down from the frequency detector or pd_up/down from the digital phase detector 104) to control the charge pump 110. The charge pump receives the corresponding signal (referred to herein simply as the "up/down signal") from the multiplexer and transfers a positive charging current to the loop filter 112 if the up/down signal is "up" or a negative charging current if the up/down signal is "down." The loop filter generates a VCO tuning signal (referred to in the figures as $V_{tune}$) in response to an output from the charge pump. In general, when a positive charging current is received from the charge pump, the tuning voltage output from the loop filter is increased, thereby causing the frequency of the VCO 102 to increase. Conversely, when a negative charging current is received from the charge pump, the tuning voltage output from the loop filter is decreased, thereby causing the frequency of the VCO to decrease.

The step size controller 114 is connected to receive the control signal (fd_en) from the frequency detector 106 and may receive a programming input from an optional programming interface 116. The step size controller outputs a step size signal (referred to in the figures as the "step_size" signal) in response to the control signal (fd_en) and the optional programming input. The step size signal (step_size) sets the step size of frequency changes that are made in response to the up/down signal that is provided directly to the VCO 102 from the digital phase detector 104. The step size controller and step size control techniques are described in more detail below with regard to FIGS. 2–12.

The VCO 102 includes inputs for receiving the VCO tuning signal ($V_{tune}$) from the loop filter 112, the pd_up/down signal directly from the digital phase detector 104, and the step size signal (step_size) from the step size controller 114. The direct input of the pd_up/down signal from the digital phase detector produces relatively small adjustments in the frequency of the VCO that are used for achieving precise control of the VCO when the PLL is in frequency lock (i.e., when the digital phase detector controls the VCO). The step size signal (step_size) sets the step size of frequency and phase changes that are made in response to the pd_up/down signal that is received directly from the digital phase detector. In an alternative embodiment, the VCO may receive the pd_up/down signal after the pd_up/down signal passes through the multiplexer 108 (at which point the pd_up/down signal is referred to simply as the up/down signal). The up/down signal can be provided directly to the VCO by a signal path that branches off the signal path between the multiplexer 108 and the charge pump 110.

Operation of the bang-bang PLL 100 depicted in FIG. 1 involves tuning the VCO 102 in response to continuous feedback from the digital phase detector 104, the frequency detector 106, and the step size controller 114. Starting at the VCO for description purposes, the VCO receives the VCO tuning signal ($V_{tune}$) from the loop filter 112, the step_size signal from the step size controller, and the pd_up/down signal directly from the digital phase detector. In response, the VCO outputs a VCO signal having a particular frequency and phase. A portion of the VCO signal ($VCO_{in}$) is fed into the digital phase detector and the frequency detector. The digital phase detector and the frequency detector generate output signals pd_up/down, fd_en, and fd_up/down) as described above in response to the VCO signal ($VCO_{in}$). When the frequency of the VCO signal is outside the deadband region (i.e., the PLL is out of frequency lock), the frequency detector controls the VCO through the VCO tuning signal ($V_{tune}$). When the frequency of the VCO is within the deadband region (i.e., the PLL is in frequency lock), the digital phase detector controls the VCO through a combination of the VCO tuning signal ($V_{tune}$) and the directly provided pd_up/down signal. The magnitude of the frequency change produced in response to the directly provided pd_up/down signal is set by the step size signal (step_size).

In accordance with the invention, the step size signal is initially set to produce relatively large frequency changes once frequency lock is established and is subsequently adjusted to produce smaller frequency changes. The initial period of relatively large frequency changes causes faster pull-in, allows for a wider deadband region, and reduces the negative effects of charge pump leakage. Subsequently adjusting the step size signal (step_size) to produce smaller frequency changes enables fine control of the PLL 100 in a regular operating state, which allows the PLL to achieve precise frequency and phase lock.

Figure 2:
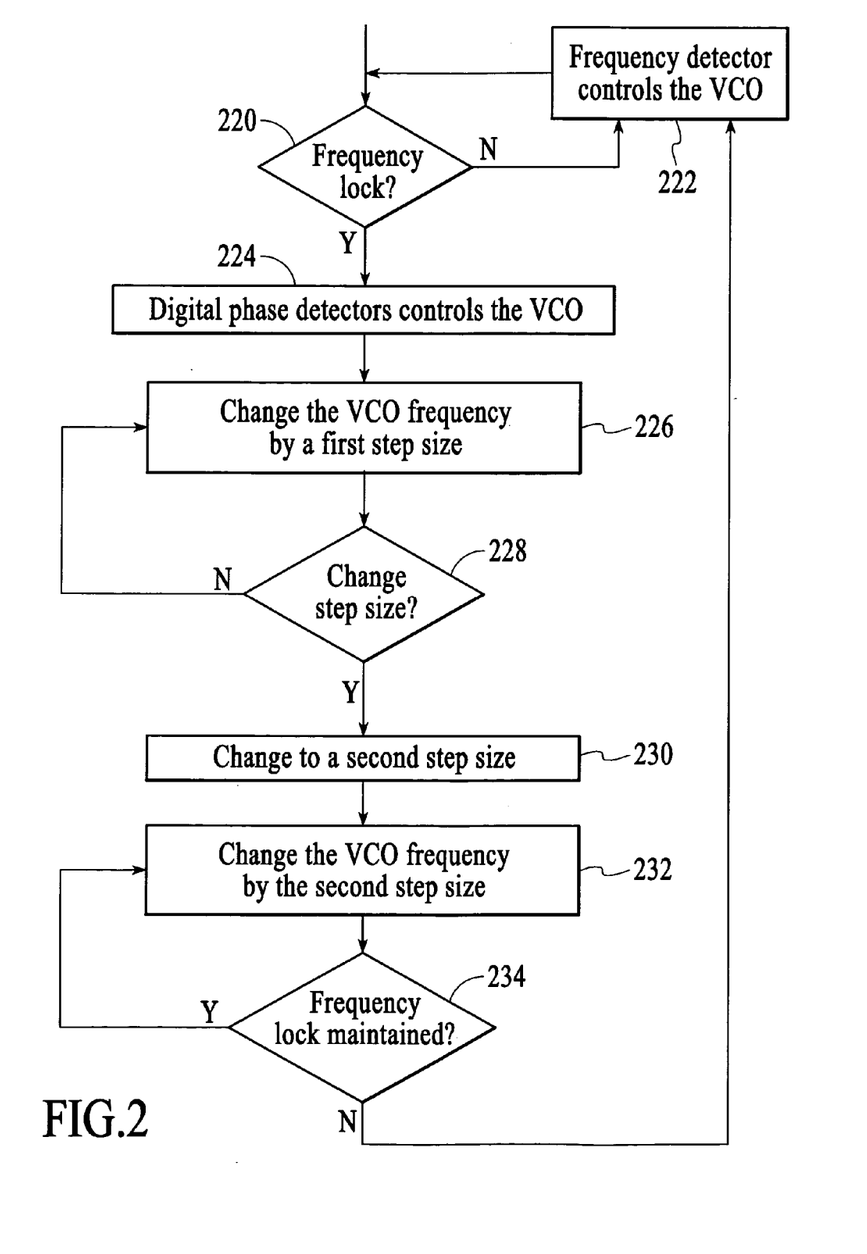
FIG. 2 depicts an example of the logic involved in controlling the step size of a VCO in accordance with the invention.

FIG. 2 depicts an example of the logic involved in controlling the step size of a VCO. First, it is determined whether the PLL is in frequency lock, decision point 220. If the PLL is not in frequency lock (i.e., the frequency of the VCO is not within the deadband region), then the frequency detector controls the VCO, block 222. If the PLL is in frequency lock (i.e., the frequency of the VCO is within the deadband region), then the digital phase detector controls the VCO, block 224. Once frequency lock is obtained and the digital phase detector controls the VCO, the VCO frequency is changed by a first step size, block 226. Next, it is determined whether the step size should be changed, decision point 228. Examples of how this determination is made are described in detail below with reference to FIGS. 6A and 7A. In an embodiment, the step size change occurs some time after frequency lock is established (i.e., after the control signal (fd_en) goes low). If the step size is not to be changed, then the VCO frequency continues to be changed by the first step size, block 226. If the step size is to be changed, then the step size is changed to a second step size, block 230. Examples of how the step size is changed are described in detail below with reference to FIGS. 8–11. After the step size is changed, the VCO frequency is changed by the second step size, block 232. Next, it is determined whether frequency lock is maintained, decision point 234. If frequency lock is maintained, then the VCO frequency continues to be changed by the second step size, block 232. If frequency lock is not maintained (i.e., the PLL falls out of lock), then the frequency detector takes over control of the VCO, block 222.

Figure 3:
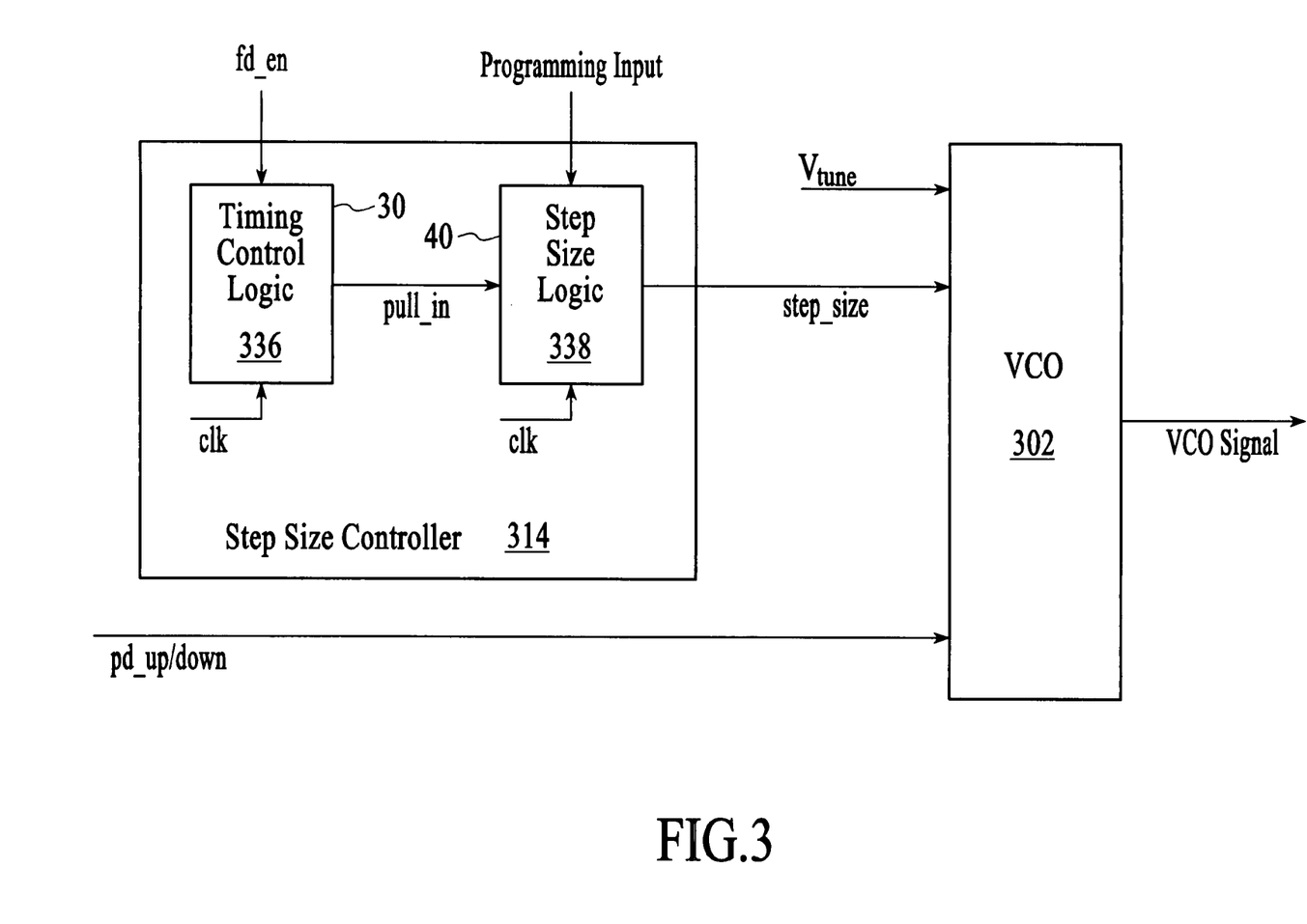
FIG. 3 depicts a VCO and an embodiment of the step size controller depicted in FIG. 1.

As stated above, the invention relates to the step size controller 114 and step size control techniques that are implemented using the step size controller. FIG. 3 depicts a VCO 302 and an embodiment of a step size controller 314 that includes timing control logic 336 and step size logic 338. The timing control logic receives the control signal (fd_en) from the frequency detector 106 (FIG. 1) and may receive a clock signal (clk) from an internal or external clock source (not shown). The function of the timing control logic is to control the timing of step size changes. In particular, the timing control logic controls the transition of the step size from an initially large step size to a smaller step size. In the embodiment of FIG. 3, the timing control logic initiates a change in the step size some time after frequency lock is established (i.e., after the control signal (fd_en) goes low). The timing control logic communicates timing control information to the step size logic via a timing control signal (referred to in the figures as the "pull_in" signal). The delay from when the frequency detector gives up control of the VCO (i.e., after the control signal (fd_en) goes low) to when step size reduction is initiated (i.e., when the control signal (pull_in) goes low) is typically chosen to be at least long enough for the PLL to pull the VCO frequency to be equal to the frequency of the input signal. In some applications, the delay is set with enough margin of error that it is not necessary to know the exact time required by the PLL to complete frequency pull-in.

The step size logic 338 receives the timing control signal (pull_in) from the timing control logic 336 and may receive a programming input from the programming interface 116 (FIG. 1) and/or a clock signal (clk) from a clock source (not shown). The function of the step size logic is to set the step size of the frequency changes that are made by the VCO 302 in response to the pd_up/down signal that is delivered directly to the VCO from the digital phase detector 104 (FIG. 7). In the embodiment of FIG. 3, the step sizes are set by the step size signal (step_size). The optional programming input is used to program the step sizes and the optional clock signal (clk) is used to control the timing of step size transitions. The step size signal (step_size) may be an analog or digital signal depending on the implementation. The step size logic may be configured to provide only two step sizes, for example, a first step size that is used initially and a second smaller step size that is transitioned to after some period of time. Alternatively, the step size logic may be configured to provide multiple intermediate step sizes that provide a transition from the largest step size to the smallest step size.

Figure 4:
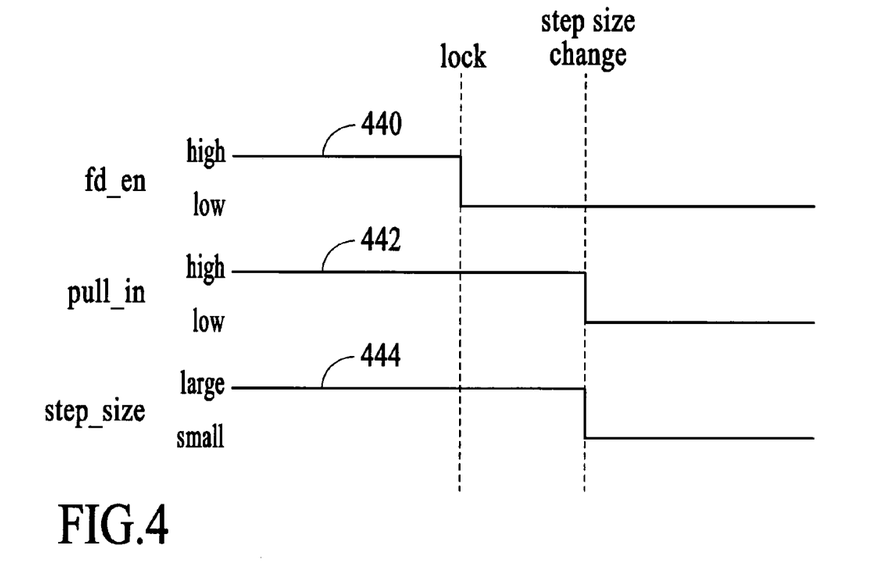
FIG. 4 depicts exemplary waveforms related to the step size controller of FIG. 3, where the step size logic provides only two step sizes.

FIG. 4 depicts exemplary waveforms of the control signal (fd_en) 440, the timing control signal (pull_in) 442, and the step size signal (step_size) 444 generated by the step size controller 314 of FIG. 3, in an example in which the step size logic provides only two step sizes. In FIG. 4, the control signal (fd_en) starts out high indicating that the PLL is out of frequency lock and then changes to low indicating that frequency lock has been established. The timing control signal (pull_in) starts out high and then changes to low after some time in response to the change in the control signal (fd_en). The change in the timing control signal (pull_in) to low in turn causes the step size signal (step_size) to go from a large value to a small value. In general, the delay between the change in the control signal (fd_en) and the change in the timing control signal (pull_in) is controlled by the timing control logic 336 and the change from the large step size to the small step size is controlled by the step size logic 338. The large step size corresponds to larger frequency changes and enables faster pull-in and a wider deadband region. The larger step size is typically used for a short time immediately after frequency lock is established. The smaller step size corresponds to smaller frequency changes and enables precise control of the VCO. The smaller step size is typically used during regular operation. That is, for all operating time except for the initial period after frequency lock is established or re-established.

Figure 5:
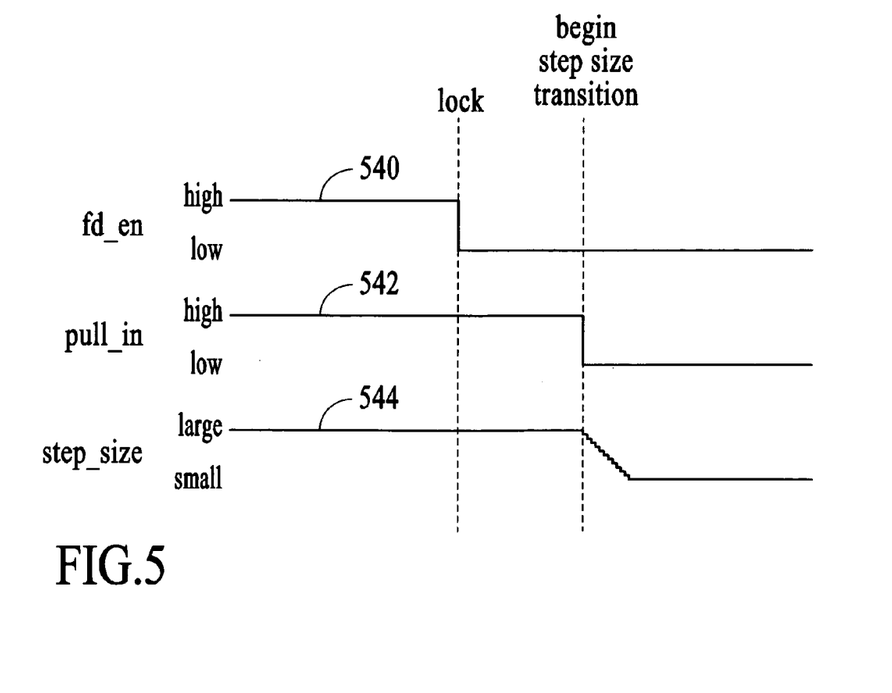
FIG. 5 depicts exemplary waveforms related to the step size controller of FIG. 3, where the step size logic provides multiple intermediate step sizes that provide a transition from the largest step size to the smallest step size.

FIG. 5 depicts exemplary waveforms of the control signal (fd_en) 540, the timing control signal (pull_in) 542, and the step size signal (step_size) 544 generated by the step size controller 314 of FIG. 3, in an example in which the step size logic provides multiple intermediate step sizes that provide a transition from the largest step size to the smallest step size. FIG. 5 is similar to FIG. 4 except that the step size signal (step_size) begins a transition from the largest to the smallest step size once the timing control signal (pull_in) goes low. It may be desirable to transition the step size from the largest to the smallest step size using multiple intermediate step sizes because in some bang-bang PLLs, changing the step size from the large value to the small value in a single jump can cause the PLL to lose frequency lock. In particular, the PLL will likely lose frequency lock if the change in frequency that is caused by the change in step size is much larger than the difference between the "up" and "down" frequency steps of the VCO in the regular operation mode. The transition from the largest to the smallest step size may involve multiple discrete stepped changes (as shown in FIG. 5) or a continuous smooth transition. If the step size is transitioned with gradual intermediate step size changes, there does not need to be any delay between when frequency lock is obtained and when the step size transition begins. The step size transition is regarded as being "gradual" when step size reduction does not get ahead of the frequency pull-in.

Figure 6A:
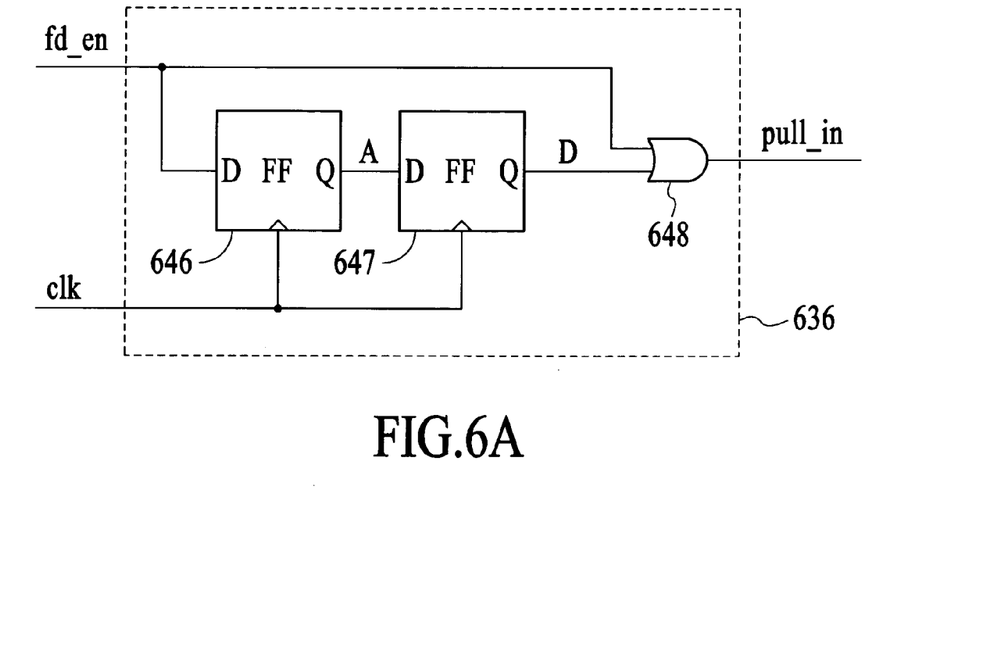
FIG. 6A depicts details of an embodiment of the timing control logic depicted in FIG. 3.
Figure 6B:
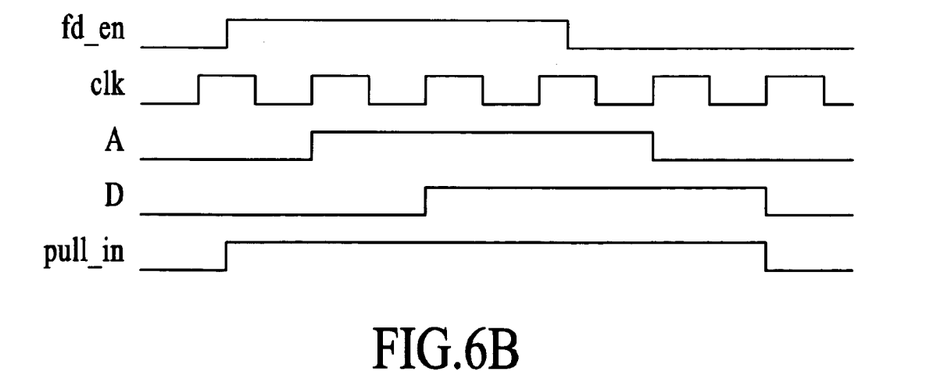
FIG. 6B depicts waveforms for an exemplary operation of the timing control logic that is depicted in FIG. 6A.

The functionality described with reference to FIGS. 1–5 can be implemented in many different ways. FIG. 6A depicts details of an embodiment of the timing control logic 336 depicted in FIG. 3. The timing control logic 636 depicted in FIG. 6A includes two flip-flops (FF) 646 and 647 and an OR gate 648. The logic functions to assert the timing control signal (pull_in) as long as the PLL is out of frequency lock (i.e., fd_en is high) and for a period of time after frequency lock is established (i.e., fd_en is low). In the implementation, the control signal (fd_en) is the data input to the first flip-flop and the clock signal (clk) is used for clocking both of the flip-flops. The output signal (A) from the first flip-flop is the data input to the second flip-flop. The output signal (D) of the second flip-flop is one of the inputs to the OR gate. In operation, the clock signal (clk) clocks the state of the control signal (fd_en) into the two flip-flops. Any changes to the control signal (fd_en) show up on signals A and D on successive edges of the clock signal (clk). The OR gate sets its output (pull_in) high while the control signal (fd_en) is high. The control signal is maintained high for one or two cycles of the clock signal (clk) after the control signal (fd_en) goes low depending on where the transition of the control signal (fd_en) occurred. Waveforms that depict an exemplary operation of the timing control logic are depicted in FIG. 6B.

While the timing control logic 636 depicted in FIG. 6A assumes that the control signal (fd_en) is high without interruption until the VCO frequency is within the deadband region, there are implementations of frequency detectors that have control signals that are high intermittently with a variable duty cycle for as long as the VCO frequency is outside the deadband region. For this type of frequency detector, the timing control logic of FIG. 6A might not work since an edge of the clock signal (clk) might miss the asynchronous pulses of the control signal (fd_en) and cause the timing control signal (pull_in) to turn off too soon.

Figure 7A:
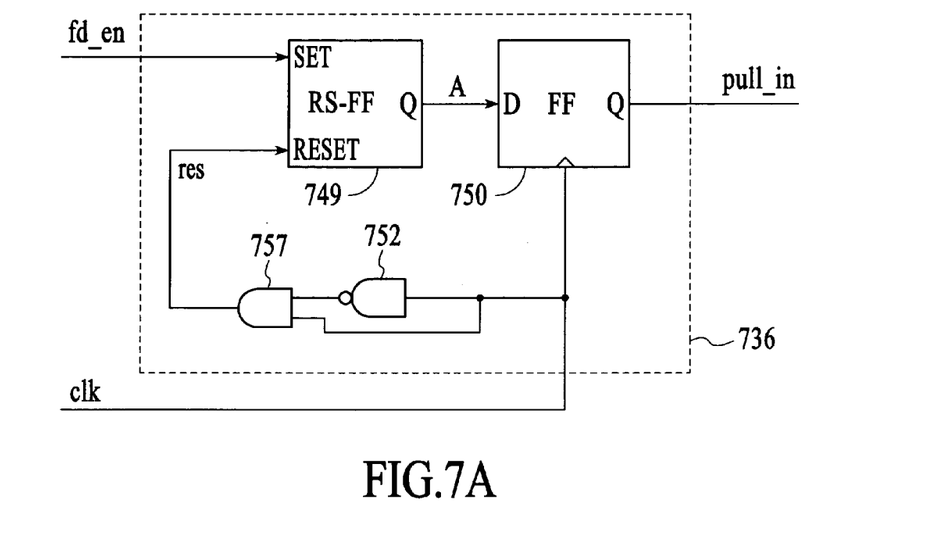
FIG. 7A depicts details of another embodiment of the timing control logic depicted in FIG. 3.

FIG. 7A depicts details of another embodiment of the timing control logic 336 depicted in FIG. 3 that is configured to work in conjunction with frequency detectors that are pulsed-on as described above. The timing control logic 736 includes a reset (RS) flip-flop 749, a flip-flop 750, an AND gate 751, and an inverter 752. When the control signal (fd_en) is high, the output signal (A) of the RS flip-flop is high. The rising edges of the clock signal (clk), the period of which should be longer than the largest gap between control signal (fd_en) pulses, clock the level on the output signal (A) to the output (pull_in) of the flip-flop 750. The rising edges of the clock signal (clk) also reset the RS flip-flop via the pulse generator that is formed by the AND gate and the inverter.

Figure 7B:
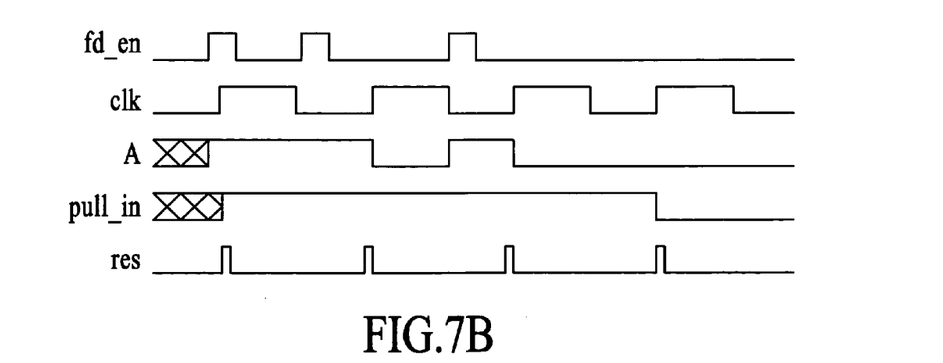
FIG. 7B depicts waveforms for an exemplary operation of the timing control logic that is depicted in FIG. 7A.

When the control signal (fd_en) stops pulsing, the RS flip-flop 749 is no longer set between clock edges and the timing control signal (pull_in) drops low after at least one more cycle of the clock signal (clk). This embodiment of the timing control logic 736 will work for both constant-on and pulsed-on type frequency detectors. Waveforms that depict an exemplary operation of the timing control logic are depicted in FIG. 7B.

Figure 8:
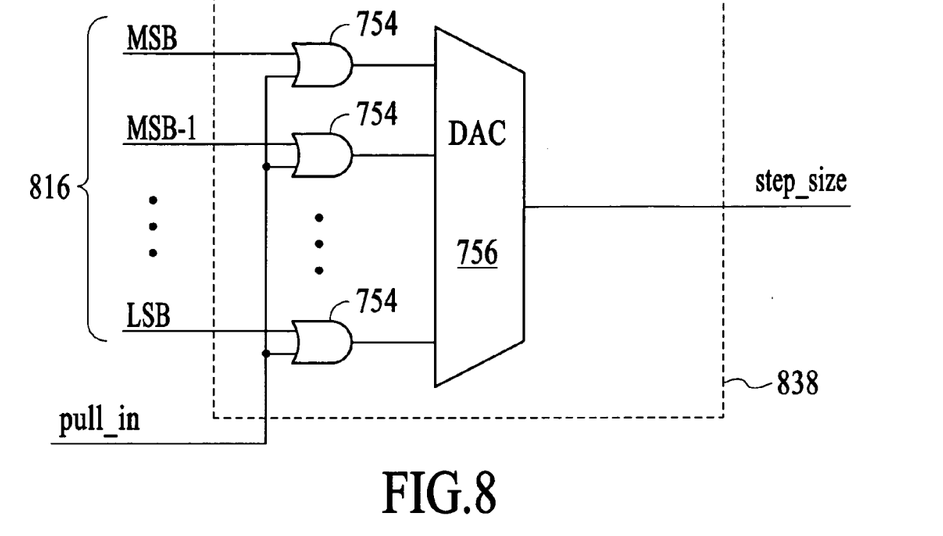
FIG. 8 depicts details of an embodiment of the step size logic depicted in FIG. 3.

FIG. 8 depicts details of an embodiment of the step size logic 338 depicted in FIG. 3. The step size logic 838 of FIG. 8 includes multiple OR gates 754 that provide outputs to a digital-to-analog converter (DAC) 756. The DAC provides an analog step size signal (step_size) as an output. Each of the OR gates includes a first input that is used to set a programmable step size and a second input that receives the timing control signal (pull_in). All of the first inputs make up a programming input 816. In operation, when the timing control signal (pull_in) is high, all of the bits that are used to drive the DAC are set to logic 1 because of the OR gates. The DAC outputs its maximum (full-scale) analog value when all of the bits are set to logic 1. When the timing control signal (pull_in) is low, the magnitude of the step size signal is set by the asserted bits of the programming input.

Figure 9:
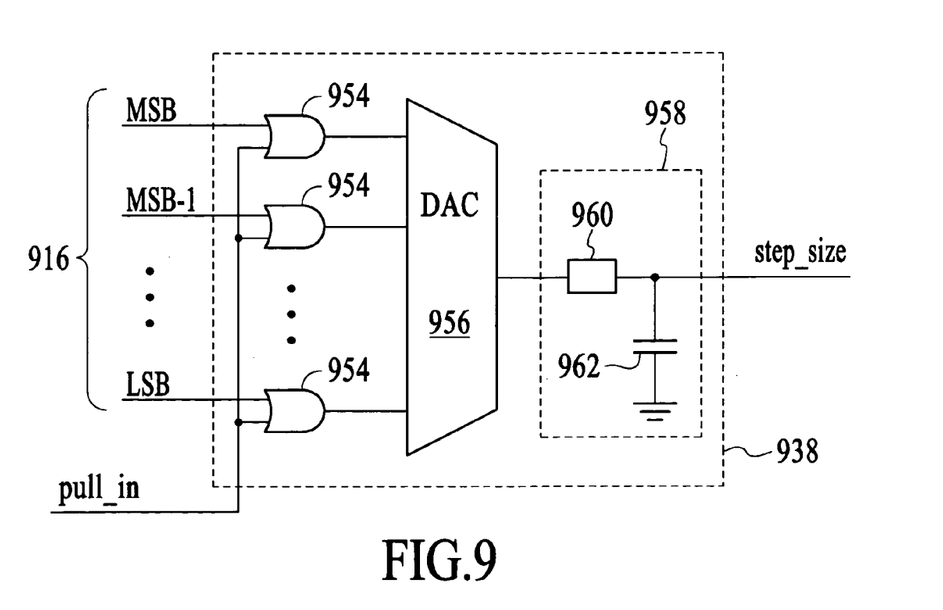
FIG. 9 depicts details of another embodiment of the step size logic depicted in FIG. 3, which is configured to provide intermediate step sizes.

As described above, it may be desirable to transition the step size from the largest to the smallest step size using multiple intermediate step sizes. FIG. 9 depicts details of another embodiment of the step size logic 338 depicted in FIG. 3 that is configured to provide intermediate step sizes. The embodiment of FIG. 9 is similar to the embodiment of FIG. 8 except that the step size logic 938 of FIG. 9 includes a low-pass filter 958 that provides the intermediate step sizes. The low-pass filter includes a resistor 960 and a capacitor 962 connected to the output of the DAC 956. The low-pass filter time constant is chosen such that it prevents the analog step size signal (step_size) from changing faster than the PLL can track the VCO disturbance. The resistor of the low pass filter may not need to be implemented as a separate physical component if the output impedance of the DAC is large enough to make a suitable low-pass filter time constant with the capacitor alone.

Figure 10:
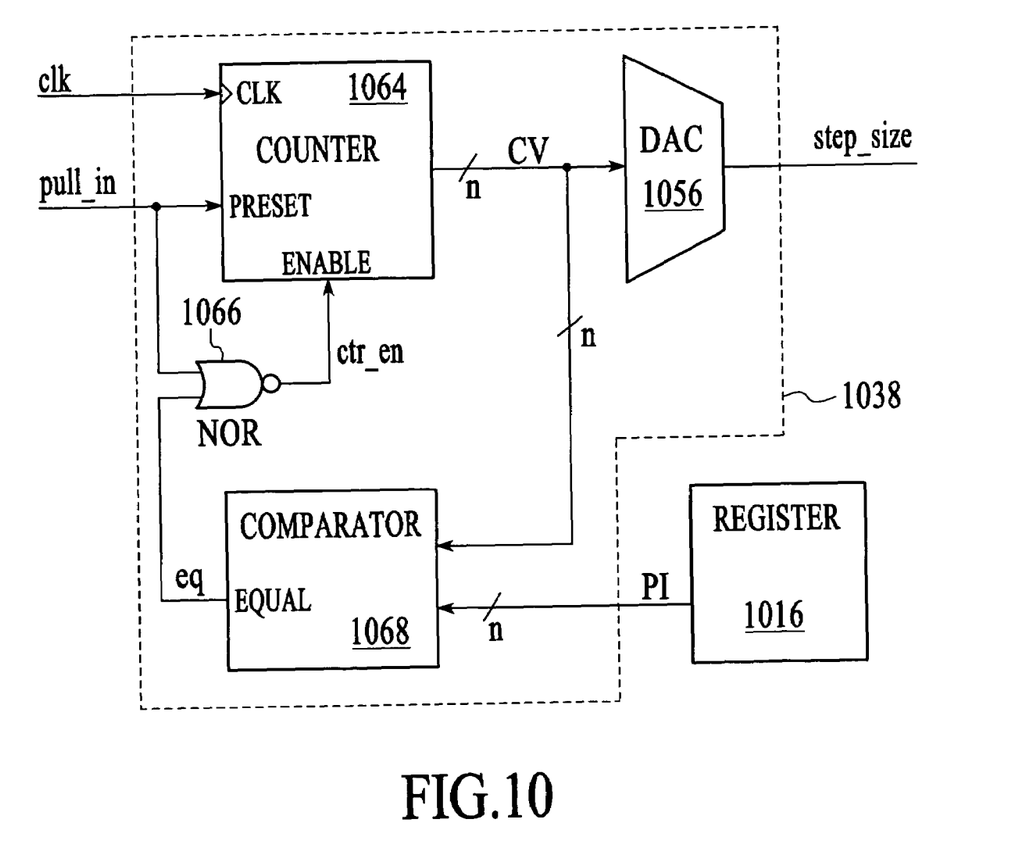
FIG. 10 depicts details of another embodiment of the step size logic depicted in FIG. 3, which is configured to provide intermediate step sizes.

FIG. 10 depicts details of another embodiment of the step size logic 338 depicted in FIG. 3 that is configured to provide intermediate step sizes. The step size logic 1038 of FIG. 10 includes a counter 1064, a NOR gate 1066, a comparator 1068, and a DAC 1056. The step size logic receives a programming input (PI) from a register 1016. In alternative embodiments, the register may be incorporated into the step size logic. The counter receives the control signal (fd_en), a clock signal (clk), and a counter enable signal (ctr_en). The counter outputs an n-bit counter value (CV) to the DAC and to the comparator. The comparator receives the n-bit counter value (CV) from the counter and an n-bit programming input (PI) from the register and outputs an equal signal (eq).

In operation, the voltage or current of the step size signal (step_size) is set by the DAC 1056. The DAC is controlled by the counter value (CV) at the output of the n-bit counter 1064. Whenever the timing control signal (pull_in) is high, the counter is preset to its maximum value via the preset input. For example, asserting the preset input sets each of the counter bits high (e.g., logical 1). The counter preset value could be any value suitable for the desired PLL pull-in rate, but setting all bits to logic 1 is easily implemented.

When the timing control signal (pull_in) is high, the counter enable signal (ctr_en) is forced to a logic 0. The counter enable signal (ctr_en) being low prevents the counter 1064 from changing state (e.g., decrementing if the counter is a down counter or incrementing if the counter is an up counter) in response to the clock signal (clk) and therefore the counter keeps outputting its preset value as the counter value (CV).

The register 1016 contains the n-bit value of the programming input (PI), which represents the value of the step size signal (step_size) that is to be used during regular operation. In a system without the accelerated pull-in, this register could be connected directly to the DAC 1056.

The comparator 1068 compares the n-bit values (PI and CV) that are output from the register 1016 and the counter 1064 and outputs an equal signal (eq) that is high if the two values are equal. The comparator outputs an equal signal (eq) that is low when the two values are not equal.

During pull-in (i.e., while the timing control signal (pull_in) is high, which forces the counter 1064 to its maximum value), the equal signal (eq) will be at logic low. When the timing control signal (pull_in) drops low, the preset function is released, the counter enable signal (ctr_en) goes low, and the counter is allowed to change state (e.g., decremented).

When both the timing control signal (pull_in) and the equal signal (eq) are low, as will generally be the case immediately after the timing control signal (pull_in) drops low, the NOR gate 1066 will output a high counter enable signal (ctr_en). The high counter enable signal (ctr_en) allows the counter to be decremented one count per clock edge until its output value matches the output value from the register 1016. When the count output from the counter equals the register value, the equal signal (eq) of the comparator 1068 will go high and the NOR gate 1066 will drop the counter enable signal (ctr_en) low. Dropping the counter enable signal (ctr_en) low prevents the counter from decrementing further and fixes the bit value that is provided to the DAC 1056 at the register value. As stated above, the register value is selected to correspond to the regular operating condition. Note that this sequence of preset and then count down to the register value will repeat itself every time the frequency detector turns on the timing control signal (pull_in) without intervention of an external control signal.

Figure 11:
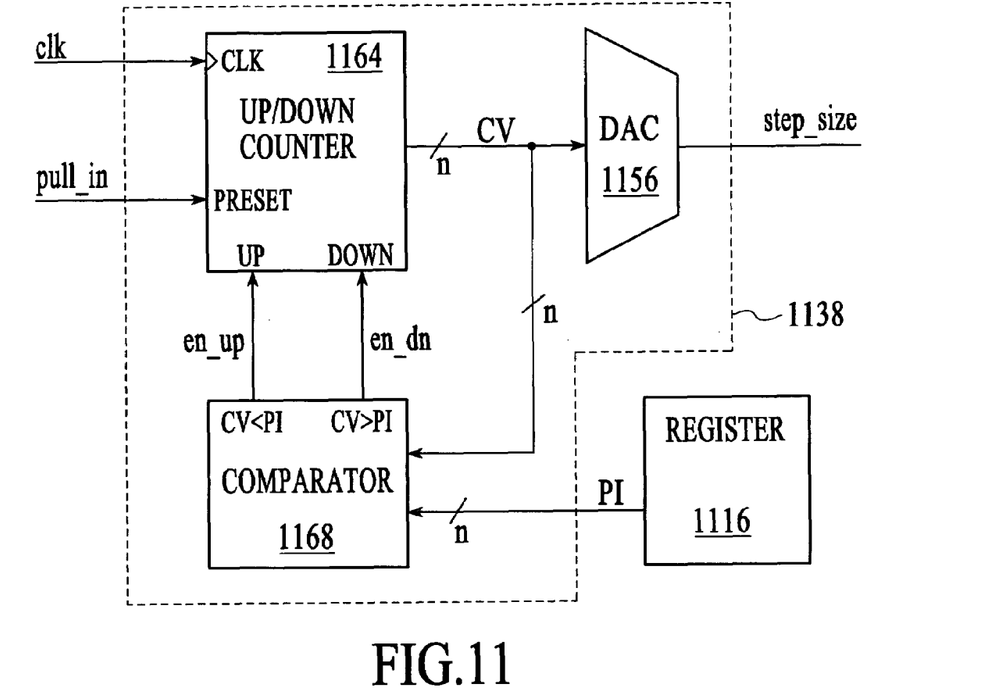
FIG. 11 depicts details of another embodiment of the step size logic depicted in FIG. 3, which is configured to allow the programming to be changed without causing a counter to roll over.

After frequency lock is established and during regular operation, there may be a need to change the value of the programming input (PI) stored in the register 1016. Changing the value of the programming input (PI) to a larger value can cause the PLL to lose frequency lock if the counter is required to "roll over" to reach the larger value. FIG. 11 depicts an embodiment of the step size logic 338 depicted in FIG. 3 that is configured to allow the programming input (PI) to be changed without requiring the counter to roll over, which would likely push the PLL out of lock. The step size logic 1138 is similar to the step size logic 1038 of FIG. 10 except that the counter is able to count up or down (the counter is referred to herein as an "up/down counter") in response to respective up or down control signals. The step size logic depicted in FIG. 11 operates similarly to the step size logic depicted in FIG. 10 with a few differences. Specifically, the comparator compares the counter value (CV) with the programming input (PI) and instead of outputting an equal signal (eq), which indicates whether the counter value (CV) and the programming input (PI) are equal, the comparator outputs an enable up (en_up) signal (e.g., en_up is high) when the counter value (CV) is less than the programming input (PI) or an enable down (en_dn) signal (e.g., en_dn is high) when the counter value (CV) is greater than the programming input (PI). The result of this logic is that the counter does not have to roll over to reach a programming input (PI) that is changed after frequency lock is achieved (e.g., trying to reach a programming input (PI) that is adjusted upward with a down counter).

Figure 12:
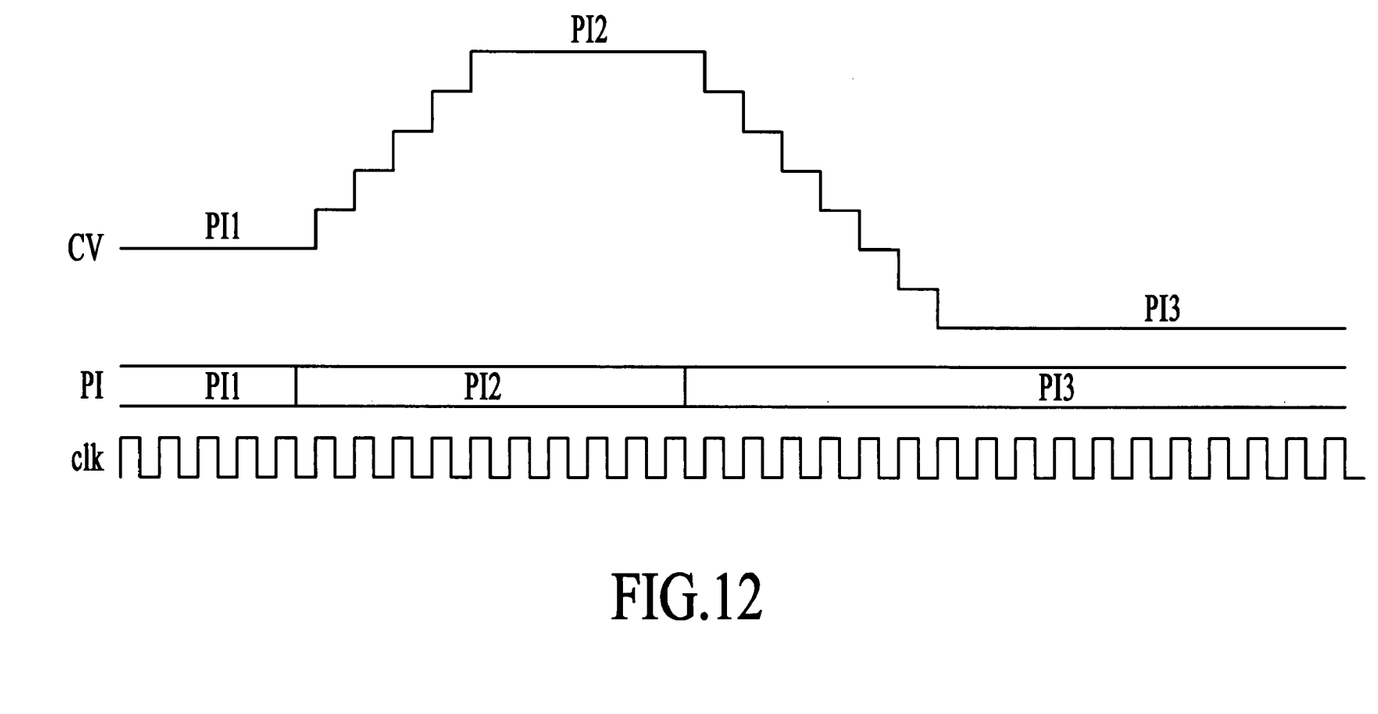
FIG. 12 depicts example waveforms that illustrates changes in a counter value and a programming input using the step size logic of FIG. 11.

FIG. 12 depicts example waveforms that illustrate how the counter value (CV) changes with changes in the programming input (PI) in the case where the programming input is increased (e.g., PV2>PV1) and in the case where the programming input (PI) is decreased (e.g., PV3<PV2) using the step size logic depicted in FIG. 11. Whether the programming input (PI) is adjusted upward or downward, the counter value (CV) changes to the programming value (PI) without rolling over in either direction.

Typically, the pd_up/down and step size signals are continuously provided to the VCO and are always influencing the VCO to some degree. However, when the VCO is being controlled by the frequency detector (e.g., when fd_en is high), the influence on the frequency of the VCO is insignificant compared to the influence of the VCO tuning signal ($V_{tune}$). That is, the magnitude of the changes in frequency caused by the direct input of the pd_up/down signal and the step size signal (step_size) are so small compared to the changes caused by the VCO tuning signal ($V_{tune}$) that they have no practical effect on the VCO frequency when the VCO is out of lock.

Because the influence of the directly input pd_up/down signal is insignificant compared to the influence of the VCO tuning signal ($V_{tune}$) when the VCO is out of lock, the step size signal can be "preset" at the desired high level before frequency lock is established. Once frequency lock is established and the frequency detector relinquishes control to the digital phase detector and the desired step size is already set.

Figure 13:
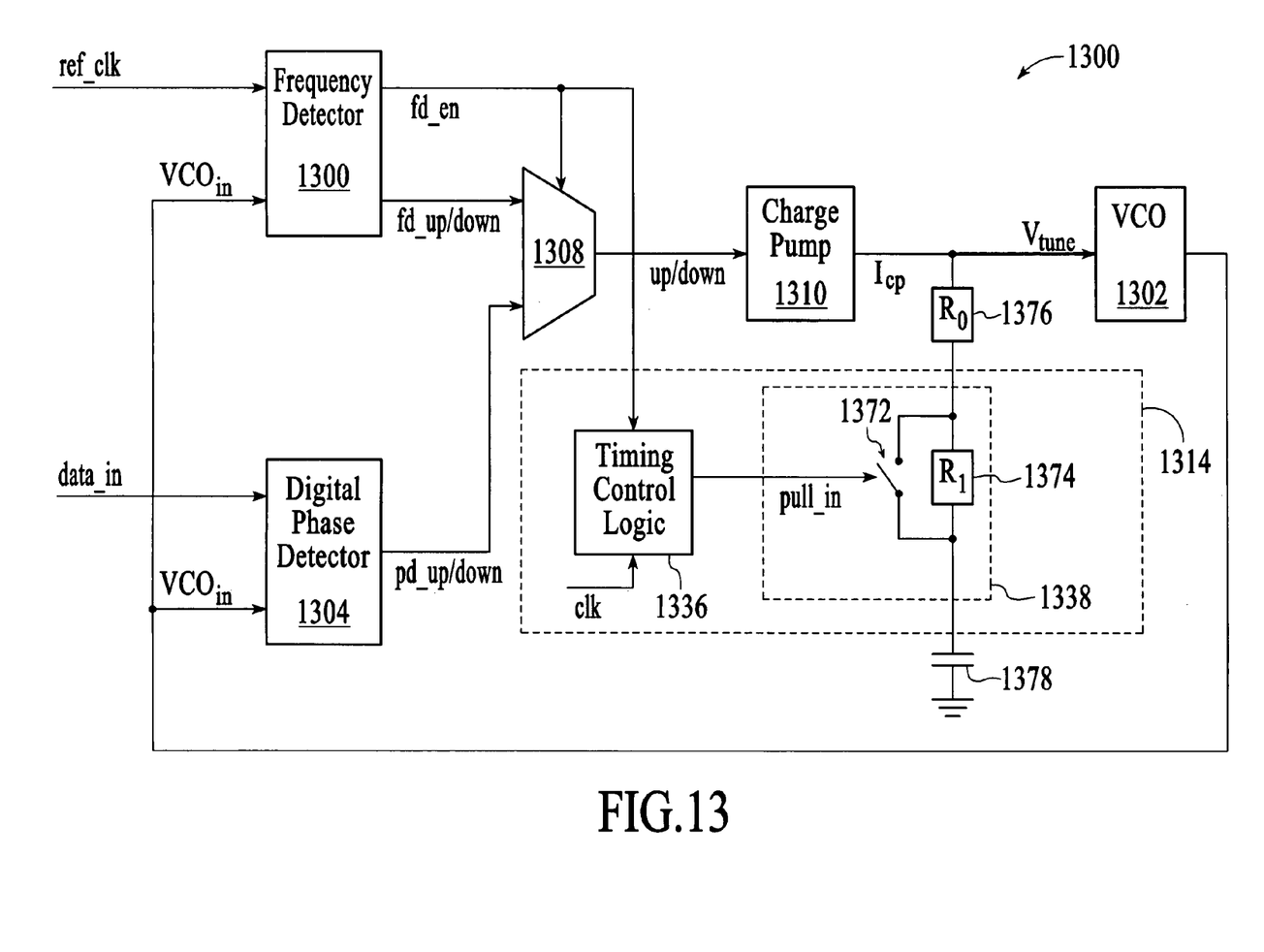
FIG. 13 depicts an embodiment of a PLL that is configured to provide two different step sizes in a PLL that does not provide a direct input to the VCO from the digital phase detector.

A bang-bang PLL can be controlled to have two different step sizes even though its VCO does not receive a direct input from the digital phase detector (e.g., the pd_up/down signal). FIG. 13 depicts an embodiment of a bang-bang PLL 1300 that is configured to provide two different step sizes when the VCO 1302 does not receive a direct input from the digital phase detector 1304. Similar to the systems described above with reference to FIGS. 1 and 3, the system of FIG. 13 includes a step size controller 1314 that controls the step size of the VCO once the VCO establishes lock (i.e., when the digital phase detector controls the VCO and fd_en is low). The step size controller includes timing control logic 1336 and step size logic 1338. The timing control logic is similar to the timing control logic described above with reference to FIGS. 3, 6A, and 7A. The timing control logic outputs a timing control signal (pull_in) to the step size logic. The step size logic includes a switch 1372 and a resistor 1374 that are in series with the resistor 1376 and the capacitor 1378 that make up the loop filter of the PLL. In operation, the step size logic 1338 determines the size of the ripple (i.e., instantaneous changes) on the VCO tuning signal ($V_{tune}$), which result from the voltage drop of the charge pump output current ($I_{cp}$) across the total resistance is series with the capacitor 1378. When the PLL is out of lock (i.e., fd_en is high), the timing control signal (pull_in) is high and the switch is open (as shown in FIG. 13). When the switch is open, the total resistance is $R=R_0+R_1$, which causes the magnitude of the ripple on the VCO tuning signal ($V_{tune}$) to be larger. The larger ripple on the VCO tuning signal ($V_{tune}$) translates to a larger step size. Some time after lock is achieved and the control signal (fd_en) goes low, the timing control signal (pull_in) will go low and cause the switch to close. When the switch is closed, the total resistance is $R=R_0$, which causes the magnitude of the ripple on the VCO tuning signal ($V_{tune}$) to be smaller than it was when the switch was open. This causes the step size to go to its regular operating condition. In an embodiment, the switch could be implemented as a MOSFET or a pair of complementary MOSFETs to form a "pass gate."

Figure 14:
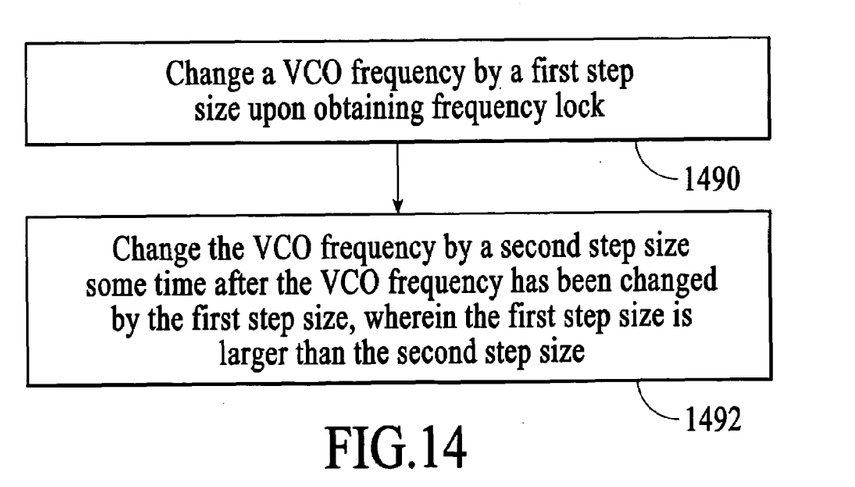
FIG. 14 is a process flow diagram of a method for controlling a VCO in a bang-bang PLL.

FIG. 14 depicts a process flow diagram of a method for controlling a VCO in a bang-bang PLL. At block 1490, a VCO frequency is changed by a first step size upon obtaining frequency lock. At block 1492, the VCO frequency is changed by a second step size after the VCO frequency has been changed by the first step size, wherein the first step size is larger than the second step size.

Although specific embodiments in accordance with the invention have been described and illustrated, the invention is not limited to the specific forms and arrangements of parts so described and illustrated. The invention is limited only by the claims.

What is claimed is:

1. A method for controlling a voltage controlled oscillator (VCO) in a bang-bang phase-locked loop, the method comprising:

changing a VCO frequency by a first step size upon establishing frequency lock, wherein establishing frequency lock comprises determining that the frequency of the VCO is within a pre-established deadband region; and changing the VCO frequency by a second step size some time after the VCO frequency has been changed by the first step size;

wherein the first step size is larger than the second step size.

2. The method of claim 1 wherein said first step size provides a faster VCO frequency pull-in rate than the second step size.

3. The method of claim 1 additionally comprising limiting the time during which the VCO frequency is changed by the first step size.

4. The method of claim 1 additionally comprising transitioning from changing the VCO frequency by the first step size to changing the VCO frequency by the second step size through at least one intermediate step size intermediate between said first and second step sizes.

5. The method of claim 4 wherein said transitioning includes low pass filtering an analog step size signal.

6. The method of claim 4 wherein said transitioning includes changing a counter value and setting the step size in response to the counter value.

7. The method of claim 4 wherein said transitioning includes changing a counter value up or down in response to a comparison of the counter value with a programming input.

8. The method of claim 1 including transitioning from the first step size to the second step size in response to a control signal that indicates frequency lock.

9. The method of claim 8 wherein the transitioning includes generating a delayed response to the control signal that indicates frequency lock.

10. The method of claim 1 further including programming the first and second step sizes.

11. A system for controlling a voltage controlled oscillator (VCO) in a bang-bang phase-locked loop, the system comprising:

a step size controller configured to:
provide a first VCO control signal to the VCO upon establishing frequency lock, wherein establishing frequency lock comprises determining that the frequency of the VCO is within a pre-established deadband region, said first VCO control signal causing the VCO frequency to change by a first step size; and
provide a second VCO control signal to the VCO some time after the VCO frequency has changed in response to the first VCO control signal, said second VCO control signal causing the VCO frequency to change by a second step size, wherein the first step size is larger than the second step size.

12. The system of claim 11 wherein the step size controller is configured to limit the time over which the VCO frequency is changed by the first step size.

13. The system of claim 11 wherein the step size controller is additionally configured to transition from providing the first VCO control signal to providing the second VCO control signal by providing at least one intermediate VCO control signal, said at least one intermediate VCO control signal causing the VCO frequency to change by a step size intermediate between said first and second step sizes.

14. The system of claim 11 wherein the step size controller is configured to transition to providing the second VCO control signal in response to a control signal that indicates frequency lock.

15. The system of claim 11 wherein the step size controller comprises:
   timing control logic configured to control the timing of transitioning from the first VCO control signal to the second VCO control signal in response to a control signal that indicates frequency lock; and
   step size logic in signal communication with the timing control logic configured to transition from the first VCO control signal to the second VCO control signal in response to a timing control signal from the timing control logic.

16. A system for controlling a voltage controlled oscillator (VCO) in a bang-bang phase-locked loop, the system comprising:
   timing control logic configured to control the timing of changes in VCO frequency step size in response to a control signal that indicates frequency lock, wherein frequency lock is established when the frequency of the VCO is within a pre-established deadband region; and
   step size logic in signal communication with the timing control logic configured to change the VCO frequency step size from a first step size to a second step size in response to a timing control signal from the timing control logic, wherein the first step size is larger than the second step size.

17. The system of claim 16 wherein the timing control logic includes delay logic for generating the timing control signal by delaying the control signal that indicates frequency lock.

18. The system of claim 16 wherein the step size logic includes a digital-to-analog converter for converting digital step size signals into an analog step size signal.

19. The system of claim 16 wherein the step size logic is configured to output a step size signal to the VCO, which sets the VCO frequency step size.

20. The system of claim 16 wherein the step size logic includes an up/down counter and a comparator, the comparator being configured to compare a counter value from the counter with a programming input and to output a signal that causes the up/down counter to increment or decrement in response to the comparison.

21. The system of claim 16 wherein the step size logic includes a programming input for receiving step size information.

* * * * *